(12) United States Patent
Malinowski et al.

(10) Patent No.: US 11,916,136 B2
(45) Date of Patent: Feb. 27, 2024

(54) LATERAL BIPOLAR JUNCTION TRANSISTORS INCLUDING A GRADED SILICON-GERMANIUM INTRINSIC BASE

(71) Applicant: GlobalFoundries U.S. Inc., Malta, NY (US)

(72) Inventors: Arkadiusz Malinowski, Dresden (DE); Alexander Derrickson, Saratoga Springs, NY (US); Judson Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 108 days.

(21) Appl. No.: 17/739,092

(22) Filed: May 7, 2022

(65) Prior Publication Data
US 2023/0275145 A1 Aug. 31, 2023

Related U.S. Application Data

(60) Provisional application No. 63/313,993, filed on Feb. 25, 2022.

(51) Int. Cl.
*H01L 29/73* (2006.01)
*H01L 29/735* (2006.01)
(Continued)

(52) U.S. Cl.
CPC ...... *H01L 29/735* (2013.01); *H01L 21/26586* (2013.01); *H01L 21/324* (2013.01); *H01L 29/165* (2013.01); *H01L 29/6625* (2013.01)

(58) Field of Classification Search
CPC . H01L 29/735; H01L 29/165; H01L 29/6625; H01L 29/66242; H01L 29/1008; H01L 29/737
See application file for complete search history.

(56) References Cited

U.S. PATENT DOCUMENTS

| | | |
|---|---|---|
| 8,288,758 B2 | 10/2012 | Ning et al. |
| 9,209,095 B2 | 12/2015 | Chang et al. |
| (Continued) | | |

FOREIGN PATENT DOCUMENTS

| | | |
|---|---|---|
| EP | 1094523 A2 | 4/2001 |

OTHER PUBLICATIONS

European Patent Office, Extended European Search Report and Written Opinion issued in European Patent Application No. 22199708.3 dated Jul. 26, 2023 (10 pages).

(Continued)

*Primary Examiner* — Syed I Gheyas
(74) *Attorney, Agent, or Firm* — Thompson Hine LLP; Francois Pagette

(57) ABSTRACT

Structures for a bipolar junction transistor and methods of forming a structure for a bipolar junction transistor. The structure includes a first terminal having a first raised semiconductor layer on a semiconductor substrate, a second terminal having a second raised semiconductor layer on the semiconductor substrate, and an intrinsic base on the semiconductor substrate. The intrinsic base is positioned in a lateral direction between the first raised semiconductor layer of the first terminal and the second raised semiconductor layer of the second terminal. The intrinsic base includes a portion containing silicon-germanium with a germanium concentration that is graded in the lateral direction.

20 Claims, 4 Drawing Sheets

(51) Int. Cl.
*H01L 21/265* (2006.01)
*H01L 21/324* (2006.01)
*H01L 29/165* (2006.01)
*H01L 29/66* (2006.01)

(56) References Cited

U.S. PATENT DOCUMENTS

| | | |
|---|---|---|
| 9,525,027 B2 | 12/2016 | Hashemi et al. |
| 9,647,099 B2 | 5/2017 | Cai et al. |
| 2003/0054601 A1* | 3/2003 | Yuki ................. H01L 29/66242 |
| | | 257/E29.188 |
| 2005/0037587 A1 | 2/2005 | Martinet et al. |
| 2011/0230031 A1 | 9/2011 | Griglione |
| 2015/0263091 A1 | 9/2015 | Hashemi et al. |
| 2018/0277666 A1 | 9/2018 | Chu et al. |
| 2019/0097022 A1 | 3/2019 | Kim et al. |
| 2021/0091212 A1 | 3/2021 | Holt et al. |

OTHER PUBLICATIONS

J. R. Senna and R. L. Smith, "Gallium Doping For Silicon Etch Stop In Koh," Proceedings of the International Solid-State Sensors and Actuators Conference—Transducers '95, pp. 194-197, doi: 10.1109/SENSOR.1995.717136; 41-PA 4 (1995).

* cited by examiner

LATERAL BIPOLAR JUNCTION TRANSISTORS INCLUDING A GRADED SILICON-GERMANIUM INTRINSIC BASE

CROSS-REFERENCE TO RELATED APPLICATIONS

This application claims the benefit of U.S. Provisional Patent Application No. 63/313,993, filed Feb. 25, 2022, which is hereby incorporated by reference herein in its entirety.

BACKGROUND

This disclosure relates generally to semiconductor devices and integrated circuit fabrication and, in particular, to structures for a bipolar junction transistor and methods of forming a structure for a bipolar junction transistor.

A bipolar junction transistor is a multi-terminal electronic device that includes an emitter, a collector, and an intrinsic base arranged between the emitter and collector to define junctions. In a PNP bipolar junction transistor, the emitter and collector are comprised of p-type semiconductor material, and the intrinsic base is comprised of n-type semiconductor material. In an NPN bipolar junction transistor, the emitter and collector are comprised of n-type semiconductor material, and the intrinsic base is comprised of p-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates junctions that are heterojunctions. For example, the collector and emitter of a heterojunction bipolar transistor may be constituted by silicon, and the intrinsic base of a heterojunction bipolar transistor may be constituted by silicon-germanium, which is characterized by a narrower band gap than silicon.

Improved structures for a bipolar junction transistor and methods of forming a structure for a bipolar junction transistor are needed.

SUMMARY

In an embodiment of the invention, a structure for a lateral bipolar junction transistor is provided. The structure comprises a first terminal including a first raised semiconductor layer on a semiconductor substrate, a second terminal including a second raised semiconductor layer on the semiconductor substrate, and an intrinsic base on the semiconductor substrate. The intrinsic base is positioned in a lateral direction between the first raised semiconductor layer of the first terminal and the second raised semiconductor layer of the second terminal. The intrinsic base includes a portion comprising silicon-germanium with a germanium concentration that is graded in the lateral direction.

In an embodiment of the invention, a method of forming a structure for a lateral bipolar junction transistor is provided. The method comprises forming a first terminal including a first raised semiconductor layer on a semiconductor substrate, forming a second terminal including a second raised semiconductor layer on the semiconductor substrate, and forming an intrinsic base on the semiconductor substrate that is positioned in a lateral direction between the first raised semiconductor layer of the first terminal and the second raised semiconductor layer of the second terminal. The intrinsic base includes a portion comprising silicon-germanium with a germanium concentration that is graded in the lateral direction.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
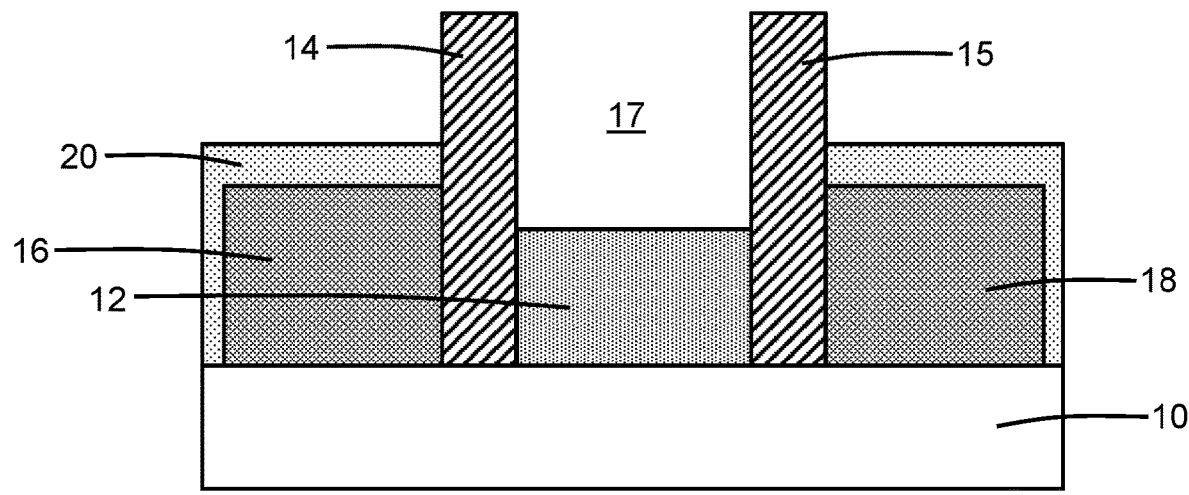
FIGS. 1-6 are cross-sectional views of a structure at successive fabrication stages of a processing method in accordance with embodiments of the invention.

With reference to FIG. 1 and in accordance with embodiments of the invention, a semiconductor substrate 10 is comprised of a semiconductor material, such as single-crystal silicon. A semiconductor layer 12 may be formed by patterning the semiconductor substrate 10 with lithography and etching processes, or by patterning an epitaxially-grown layer. In an embodiment, the semiconductor layer 12 may be comprised of single-crystal silicon and lack germanium. In an embodiment, the semiconductor layer 12 may be comprised of single-crystal silicon-germanium that has a uniform germanium concentration. In an embodiment, the semiconductor layer 12 may be doped (e.g., lightly doped) with a concentration of a p-type dopant (e.g., boron) to provide p-type conductivity. The semiconductor layer 12 may provide a portion of an intrinsic base of the bipolar junction transistor.

Dielectric spacers 14, 15 may be formed at opposite sides of the semiconductor layer 12 by anisotropically etching a deposited conformal dielectric layer. The dielectric spacers 14, 15 may be comprised of a dielectric material, such as silicon nitride. The dielectric spacers 14, 15 project above a top surface of the semiconductor layer 12 as an artifact of the process used to form the semiconductor layer 12, and a cavity 17 exists above semiconductor layer 12 and laterally between the dielectric spacer 14 and the dielectric spacer 15.

Semiconductor layers 16, 18 are formed on the semiconductor substrate 10 adjacent to the opposite sides of the semiconductor layer 12. The semiconductor layers 16, 18 may provide terminals (i.e., an emitter and a collector) of the bipolar junction transistor. In an embodiment, the semiconductor layer 16 may provide an emitter, and the semiconductor layer 18 may provide a collector. In an alternative embodiment, the semiconductor layer 16 may provide a collector, and the semiconductor layer 18 may provide an emitter.

The semiconductor layers 16, 18 may be comprised of a semiconductor material, such as single-crystal silicon. The semiconductor layers 16, 18 may be doped (e.g., heavily doped) with a concentration of a dopant, such as an n-type dopant (e.g., phosphorus) to provide n-type conductivity. The semiconductor layers 16, 18 may be concurrently formed using an epitaxial growth process and may contain single-crystal semiconductor material (e.g., single-crystal silicon).

The dielectric spacer 14 is positioned in a lateral direction between the semiconductor layer 12 and the semiconductor layer 16. The dielectric spacer 15 is positioned in a lateral direction between the semiconductor layer 12 and the semiconductor layer 18. A dielectric layer 20 comprised of, for example, silicon nitride may be applied that coats the semiconductor layers 16, 18.

Figure 2:
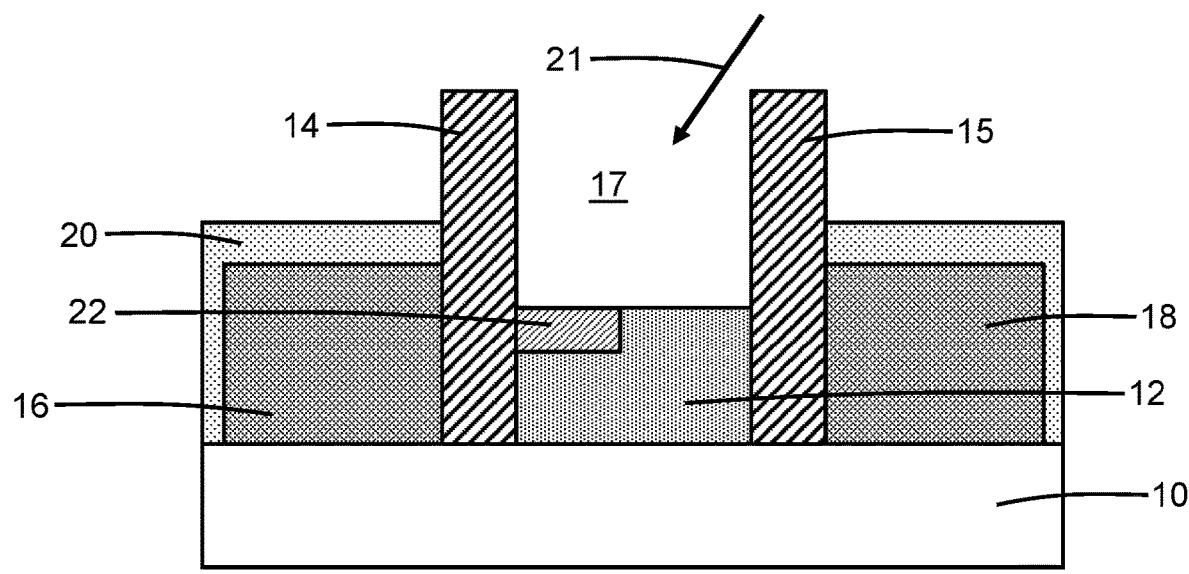

With reference to FIG. 2 in which like reference numerals refer to like features in FIG. 1 and at a subsequent fabrication stage, a tilted ion implantation is performed to implant ions, as diagrammatically shown by a single-headed arrow 21, into a section 22 of the semiconductor layer 12. The dielectric spacer 15 blocks the implantation of the ions 21 into another section of the semiconductor layer 12 (i.e., a non-implanted section that is adjacent to the section 22 and that is laterally between the section 22 and the dielectric spacer 15) due to shadowing of the surface area caused by the off-normal incidence of the ions 21 during ion implantation. The tilt angle relative to the surface normal is chosen to define the extent of the shadowing by the dielectric spacer 15 and the selectively-implanted volume forming the section 22. In an embodiment, the tilted ion implantation is performed with the semiconductor substrate 10 fixed in position.

An unimplanted section of the semiconductor layer 12 exists following the formation of the implanted section 22. In an embodiment, the implanted section 22 may extend from the top surface of the semiconductor layer 12 partially through the semiconductor layer 12. In an alternative embodiment, the implanted section 22 may extend from the top surface of the semiconductor layer 12 fully through the semiconductor layer 12. In an embodiment, the implanted section 22 may include a single atomic layer positioned proximate to the top surface of the semiconductor layer 12. In an embodiment, the implanted section 22 may be larger than the unimplanted section of the semiconductor layer 12. In an embodiment, the implanted section 22 may be smaller than the unimplanted section of the semiconductor layer 12. In an embodiment, the implanted section 22 and the unimplanted section of the semiconductor layer 12 may have equal sizes.

The implanted section 22 of the semiconductor layer 12 is altered to facilitate a subsequent selective etching process in which the implanted section 22 of the semiconductor layer 12 has a significantly lower etch rate (i.e., a poisoned surface area). The implantation may change the crystalline structure of the implanted section 22 of the semiconductor layer 12 (e.g., amorphization) and/or change the material properties of the implanted section 22 of the semiconductor layer 12 from those of a semiconductor material to those of, or substantially similar to, a dielectric material. In the latter regard, the ions 21 implanted to form the implanted section 22 may be, or include, gallium, boron, or both elements, and may be performed using a single implantation or multiple implantations. In an embodiment, the concentration of implanted atoms in the implanted section 22 may be greater than or equal to $1 \times 10^{19}$ cm$^{-3}$.

Figure 3:
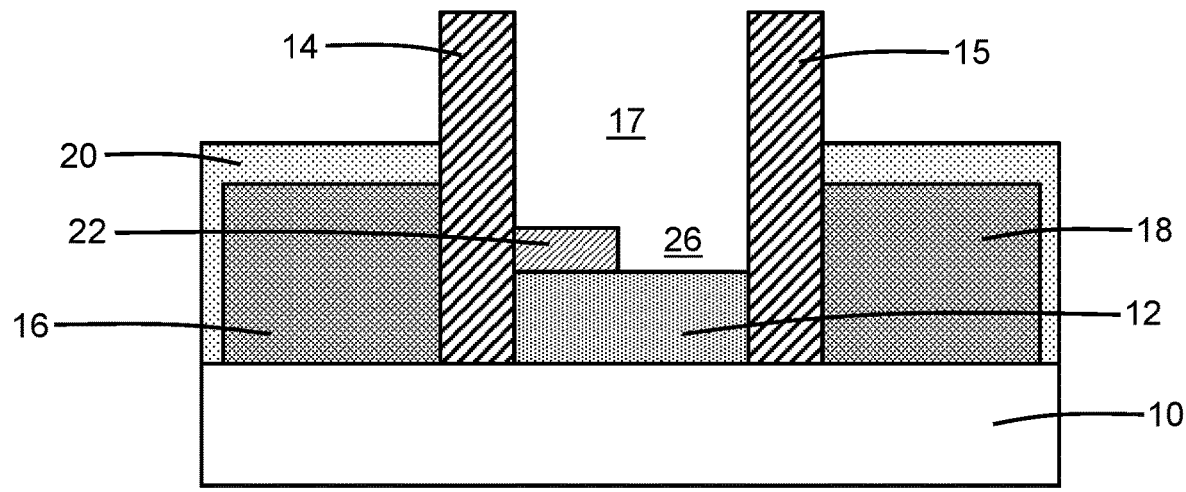

With reference to FIG. 3 in which like reference numerals refer to like features in FIG. 2 and at a subsequent fabrication stage, a cavity 26 may be formed in the semiconductor layer 12 by a selective etching process that removes the semiconductor material of the unimplanted section of the semiconductor layer 12 selective to semiconductor material of the implanted section 22 of the semiconductor layer 12. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process. In an embodiment, the cavity 26 may be formed using a wet chemical etching process that employs an etchant solution containing potassium hydroxide.

The etching process is controlled such that the cavity 26 only penetrates partially through the unimplanted section of the semiconductor layer 12 in a vertical direction. The cavity 26 is laterally offset from a vertical centerline of the semiconductor layer 12 and defines an open space in conjunction with the cavity 17. The implanted section 22 of the semiconductor layer 12, which is modified by the implanted ions 21, functions as an etch stop such that the cavity 26 is positioned in a lateral direction between the implanted section 22 and the dielectric spacer 15.

Figure 4:
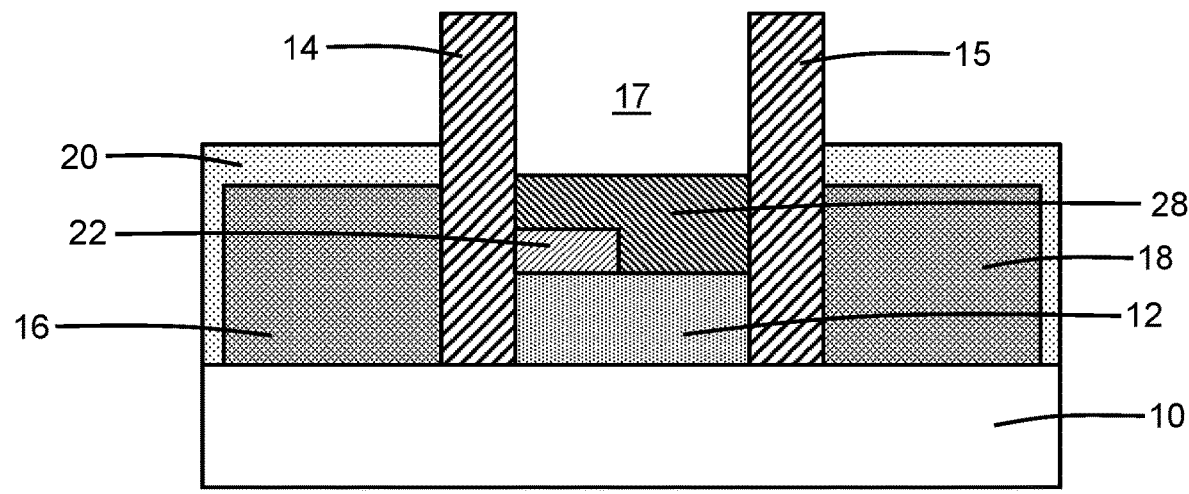

With reference to FIG. 4 in which like reference numerals refer to like features in FIG. 3 and at a subsequent fabrication stage, a semiconductor layer 28 is formed within the cavity 26 adjacent to the implanted section 22 of the semiconductor layer 12, as well within the cavity 17 over the semiconductor layer 12. The semiconductor layer 28 may be comprised of a single-crystal semiconductor material that is epitaxially grown from the exposed surfaces of the semiconductor layer 12. The semiconductor layer 28 includes a portion inside the cavity 17 and a portion inside the cavity 26. In an embodiment, the semiconductor layer 28 may be comprised of silicon-germanium including silicon and germanium with the silicon content ranging from 95 atomic percent to 50 atomic percent and the germanium content ranging from 5 atomic percent to 50 atomic percent. In an embodiment, the germanium content of the semiconductor layer 28 may be uniform or substantially uniform over its volume. The semiconductor layer 28 may be in situ doped during epitaxial growth with a concentration of a dopant, such as a p-type dopant (e.g., boron) that provides p-type conductivity. In an embodiment, the semiconductor layer 28 may be uniformly doped during epitaxial growth. The semiconductor layer 28, which provides a contribution to the intrinsic base of the bipolar junction transistor, directly contacts the adjacent sections (including the implanted section 22) of the semiconductor layer 12.

Figure 5:
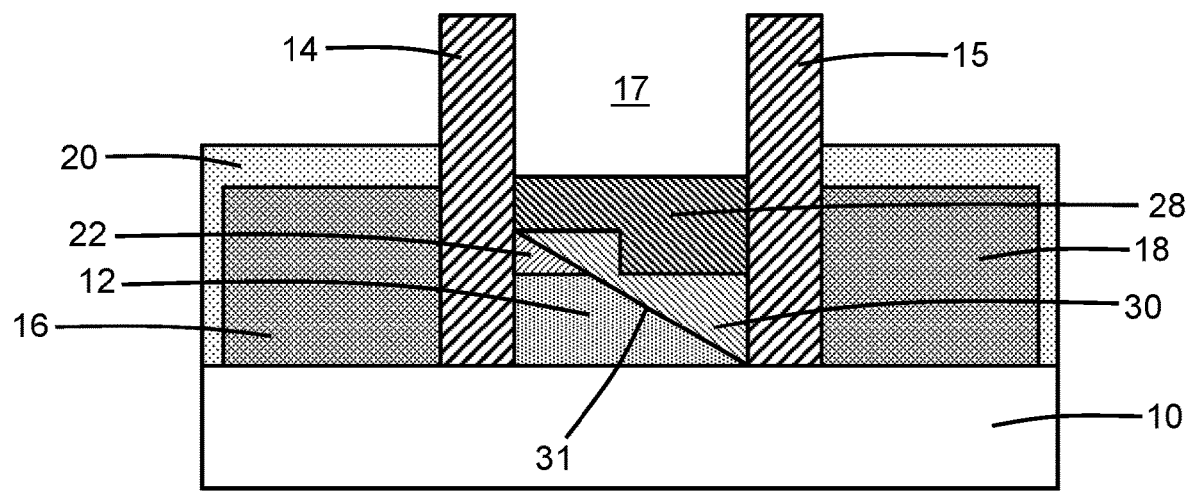

With reference to FIG. 5 in which like reference numerals refer to like features in FIG. 4 and at a subsequent fabrication stage, a thermal process, such as a rapid thermal anneal, is used to cause germanium to diffuse outwardly from the semiconductor layer 28 into a portion 30 of the semiconductor layer 12. The portion 30 may include all or part of the implanted section 22. The diffusion of germanium into the portion 30 of the semiconductor layer 12 may occur in a lateral direction and in a vertical direction. The offset positioning of the portion of the semiconductor layer 28 inside the cavity 26 adjacent to the semiconductor layer 18 results in an asymmetrical profile for the germanium that is laterally and vertically diffused into the portion 30 of the semiconductor layer 12. The thermal process may be controlled such that germanium does not diffuse into a portion of the semiconductor layer 12 that is positioned between the portion 30 and the semiconductor substrate 10. The portion of the semiconductor layer 12 that lacks diffused germanium is positioned adjacent to the semiconductor substrate 10.

An interface 31 is defined between the portion 30 of the semiconductor layer 12 that includes diffused germanium and the portion of the semiconductor layer 12 that lacks diffused germanium. Although the interface 31 is diagrammatically shown as inclined in FIG. 5, the interface 31 may have a different shape, such as a shape with a degree of curvature or an irregular shape. At and along the interface 31, the germanium concentration in the portion 30 of the semiconductor layer 12 has a minimum value and transitions from the germanium concentration in the portion 30 to the germanium concentration, if any, in the portion of the semiconductor layer 12 that lacks diffused germanium. The portion 30 of the semiconductor layer 12 with the multidirectional germanium gradient may extend in a lateral direction from the dielectric spacer 14 to the dielectric spacer 15.

The germanium concentration in the portion 30 of the semiconductor layer 12 is graded in a lateral direction and is also graded in a vertical direction. In that regard, the germanium concentration in the portion 30 may decrease with increasing distance from the semiconductor layer 28 in a lateral direction, and the germanium concentration in the portion 30 may decrease with increasing distance from the semiconductor layer 28 in a vertical direction. In an embodiment, the germanium concentration in the portion 30 may exhibit a 50 percent decrease per 10 nanometers of distance in a direction from the semiconductor layer 28 toward the interface 31. In an embodiment in which the semiconductor layer 12 is initially comprised of silicon and lacks germanium, the graded germanium profile in the portion 30 of the semiconductor layer 12 may exhibit a maximum concentration adjacent to the semiconductor layer 18 (e.g., the collector) and a minimum concentration (e.g., 0 atomic percent) at the interface 31, which is adjacent to the semiconductor layer 16 (e.g., the emitter). In an embodiment in which the semiconductor layer 12 is initially comprised of silicon-germanium with a uniform or substantially uniform germanium concentration, the minimum germanium concentration at the interface 31 may be equal to the germanium concentration in the portion of semiconductor layer 12 that lacks diffused germanium. The germanium concentration in the semiconductor layer 28, following the thermal process, may be uniform or substantially uniform and greater than or equal to the maximum germanium concentration in the portion 30 of the semiconductor layer 12.

Figure 6:
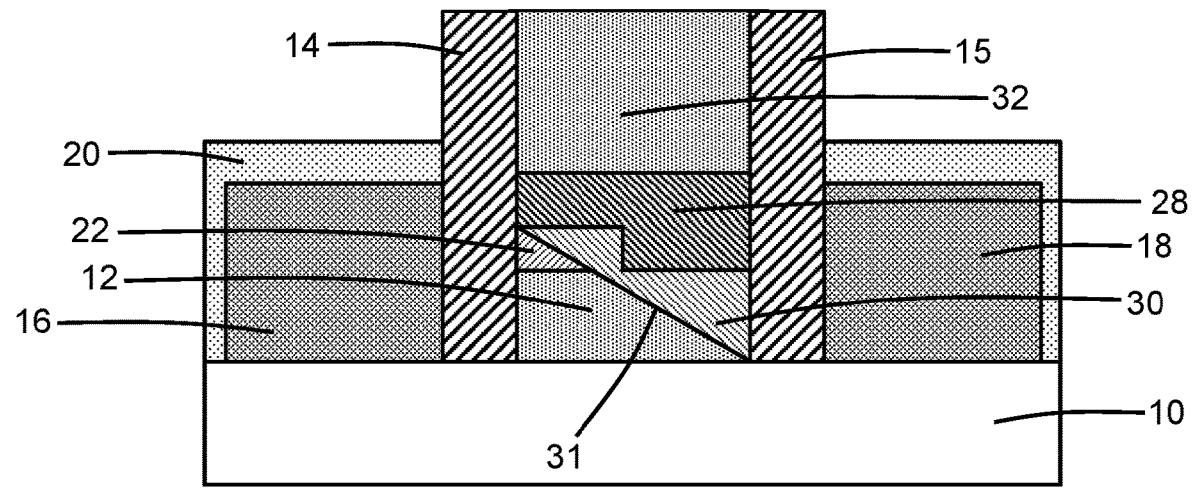

With reference to FIG. 6 in which like reference numerals refer to like features in FIG. 5 and at a subsequent fabrication stage, a semiconductor layer 32 is formed over the semiconductor layer 28. In an embodiment, the semiconductor layer 32 may be positioned fully above the semiconductor layer 28 of the intrinsic base such that the intrinsic base is positioned in a vertical direction between the semiconductor layer 32 and the semiconductor substrate 10. The semiconductor layer 32 may be comprised of a heavily-doped semiconductor material, such as polysilicon that is heavily doped with a concentration of a p-type dopant (e.g., boron) to provide p-type conductivity. The semiconductor layer 32 may provide an extrinsic base of the bipolar junction transistor.

The resultant structure is a lateral bipolar junction transistor that includes a laterally-arranged emitter, base, and collector. The semiconductor layers 16, 18 constitute the emitter and collector of the lateral bipolar junction transistor. The portion 30 of the semiconductor layer 12, the portion of the semiconductor layer 12 that lacks diffused germanium, and the semiconductor layer 28 may provide different portions of an intrinsic base of the lateral bipolar junction transistor. The germanium concentration in the portion 30 of the semiconductor layer 12 is graded in a lateral direction between the semiconductor layer 28 and the interface 31, and is also graded in a vertical direction between the semiconductor layer 28 and the interface 31. In the representative embodiment, the semiconductor layers 16, 18 may contain an n-type dopant, and the semiconductor layers 12, 28, 32 may contain a p-type dopant. In an alternative embodiment, the semiconductor layers 16, 18 may contain a p-type dopant, and the semiconductor layers 12, 28, 32 may contain an n-type dopant.

Figure 7:
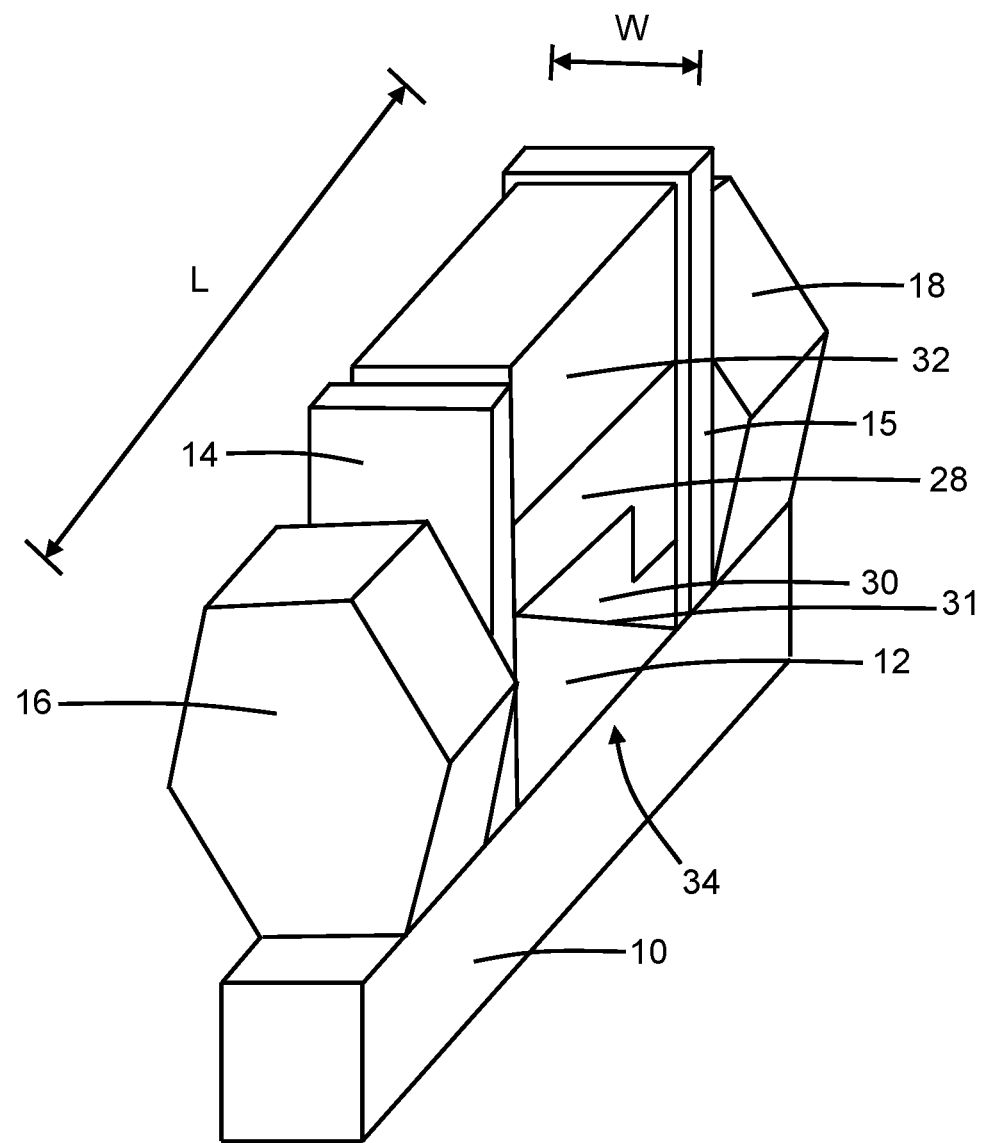
FIG. 7 is a perspective view of a structure in accordance with alternative embodiments of the invention.

With reference to FIG. 7 in which like reference numerals refer to like features in FIG. 6 and in accordance with alternative embodiments, the semiconductor layer 12 and the semiconductor layer 28 may constitute a fin structure 34 projecting in a vertical direction from the semiconductor substrate 10. The fin structure 34 has a width W and a length L that is greater than the width. The lateral grading of the germanium concentration in portion 30 of the semiconductor layer 12 may extend in a direction along the length of the fin structure 34. In an embodiment, the semiconductor layers 16, 18 may have a faceted shape.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a lateral bipolar junction transistor, the structure comprising:
   a semiconductor substrate;
   a first terminal including a first raised semiconductor layer on the semiconductor substrate;
   a second terminal including a second raised semiconductor layer on the semiconductor substrate; and
   an intrinsic base including a first portion, a second portion, and a third portion, the first portion of the intrinsic base positioned in a lateral direction between the first raised semiconductor layer of the first terminal and the second raised semiconductor layer of the second terminal, the first portion of the intrinsic base positioned in a vertical direction between the third portion of the intrinsic base and the second portion of the intrinsic base, the second portion of the intrinsic base positioned in the vertical direction between the first portion of the intrinsic base and the semiconductor substrate, the first portion of the intrinsic base comprising silicon-germanium with a first germanium concentration that is graded in the lateral direction, and the third portion of the intrinsic base comprising silicon-germanium with a second germanium concentration that is greater than a maximum value of the first germanium concentration.

2. The structure of claim 1 wherein the first germanium concentration in the first portion of the intrinsic base is graded in the vertical direction relative to the semiconductor substrate.

3. The structure of claim 1 wherein the intrinsic base includes a fin structure that projects in the vertical direction from the semiconductor substrate.

4. The structure of claim 3 wherein the fin structure has a length and a width, and the grading of the first germanium concentration in the first portion of the intrinsic base extends along the length of the fin structure.

5. The structure of claim 1 further comprising:
   a first dielectric spacer positioned in the lateral direction between the first raised semiconductor layer and the first portion of the intrinsic base: and
   a second dielectric spacer positioned in the lateral direction between the second raised semiconductor layer and the first portion of the intrinsic base,
   wherein the first portion of the intrinsic base extends from the first dielectric spacer to the second dielectric spacer.

6. The structure of claim 1 wherein the first germanium concentration in the first portion of the intrinsic base decreases in a direction from the first raised semiconductor layer to the second raised semiconductor layer.

7. The structure of claim 6 wherein the first terminal is a collector of the bipolar junction transistor, and the second terminal is an emitter of the bipolar junction transistor.

8. The structure of claim 1 further comprising:
   an extrinsic base on the third portion of the intrinsic base, the extrinsic base comprising a heavily-doped semiconductor material.

9. The structure of claim 1 wherein the second portion of the intrinsic base comprises silicon-germanium with a third germanium concentration that is substantially uniform and that is less than a minimum value of the first germanium concentration.

10. The structure of claim 1 wherein the second portion of the intrinsic base comprises silicon and lacks a germanium concentration.

11. A structure for a bipolar junction transistor, the structure comprising:
    a semiconductor substrate;
    a first terminal including a first raised semiconductor layer on the semiconductor substrate;
    a second terminal including a second raised semiconductor layer on the semiconductor substrate; and
    an intrinsic base including a first portion and a second portion, the first portion of the intrinsic base positioned in a lateral direction between the first raised semiconductor layer of the first terminal and the second raised semiconductor layer of the second terminal, the second portion of the intrinsic base positioned in a vertical direction between the first portion of the intrinsic base and the semiconductor substrate, and the first portion of the intrinsic base comprising silicon-germanium with a first germanium concentration that is graded in the lateral direction,
    wherein the first portion of the intrinsic base and the second portion of the intrinsic base adjoin along an interface, and the first germanium concentration has a minimum value at the interface.

12. The structure of claim 11 wherein the first germanium concentration in the first portion of the intrinsic base is graded in the vertical direction relative to the semiconductor substrate.

13. The structure of claim 11 wherein the first germanium concentration in the first portion of the intrinsic base decreases in a direction from the first raised semiconductor layer to the second raised semiconductor layer.

14. A method of forming a structure for a lateral bipolar junction transistor, the method comprising:
    forming a first terminal including a first raised semiconductor layer on a semiconductor substrate;
    forming a second terminal including a second raised semiconductor layer on the semiconductor substrate; and
    forming an intrinsic base including a first portion and a second portion, wherein the first portion of the intrinsic base is positioned on the semiconductor substrate in a lateral direction between the first raised semiconductor layer of the first terminal and the second raised semiconductor layer of the second terminal, and the second portion of the intrinsic base positioned in a vertical direction between the first portion of the intrinsic base and the semiconductor substrate, the first portion of the intrinsic base comprises silicon-germanium with a first germanium concentration that is graded in the lateral direction, the first portion of the intrinsic base and the second portion of the intrinsic base adjoin along an interface, and the first germanium concentration has a minimum value at the interface.

15. The method of claim 14 wherein the first germanium concentration in the first portion of the intrinsic base is graded in the vertical direction relative to the semiconductor substrate.

16. The method of claim 14 wherein forming the intrinsic base including the first portion that is positioned on the semiconductor substrate in the lateral direction between the first raised semiconductor layer of the first terminal and the second raised semiconductor layer of the second terminal comprises:
    depositing a first layer comprised of a first semiconductor material;
    implanting a first section of the first layer; and
    removing a second section of the first layer that is adjacent to the first section to define a cavity.

17. The method of claim 16 wherein implanting the first section of the first layer comprises:
  performing a tilted implantation of boron or gallium into the first section of the first layer.

18. The method of claim 17 wherein removing the second section of the first layer that is adjacent to the first section to define the cavity comprises:
  performing a wet chemical etching process using an etchant comprising potassium hydroxide.

19. The method of claim 16 further comprising:
  depositing a second layer comprised of a second semiconductor material containing a second germanium concentration, wherein the second layer includes a portion inside the cavity; and
  performing a thermal process to cause germanium to diffuse in the lateral direction from the second layer into the first layer.

20. The method of claim 19 wherein the thermal process causes the germanium to diffuse from the second layer into the first layer.

\* \* \* \* \*